(12) United States Patent
Srinivasa et al.

(10) Patent No.: US 11,468,941 B2
(45) Date of Patent: Oct. 11, 2022

(54) MEMORY ARCHITECTURE WITH PULSED-BIAS POWER

(71) Applicant: Arm Limited, Cambridge (GB)

(72) Inventors: Akash Bangalore Srinivasa, Bangalore (IN); Andy Wangkun Chen, Austin, TX (US); Penaka Phani Goberu, Bangalore (IN); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/193,632

(22) Filed: Mar. 5, 2021

(65) Prior Publication Data

US 2022/0284942 A1 Sep. 8, 2022

(51) Int. Cl.
| | | |
|---|---|---|
| G11C 11/4074 | (2006.01) | |
| G11C 5/06 | (2006.01) | |
| G11C 11/4093 | (2006.01) | |
| G11C 5/14 | (2006.01) | |
| G11C 11/4094 | (2006.01) | |
| G11C 11/4076 | (2006.01) | |
| H03K 19/017 | (2006.01) | |

(52) U.S. Cl.
CPC .......... *G11C 11/4074* (2013.01); *G11C 5/063* (2013.01); *G11C 5/14* (2013.01); *G11C 11/4076* (2013.01); *G11C 11/4093* (2013.01); *G11C 11/4094* (2013.01); *H03K 19/01742* (2013.01)

(58) Field of Classification Search
CPC ............ G11C 11/4074; G11C 11/4076; G11C 11/4093; G11C 11/4094; G11C 5/063; G11C 5/14; H03K 19/01742
See application file for complete search history.

(56) References Cited

U.S. PATENT DOCUMENTS

| 4,349,915 | A * | 9/1982 | Costas | ................... | H04B 7/005 |
| | | | | | 375/267 |
| 5,572,715 | A * | 11/1996 | Gowni | .............. | H03K 19/1772 |
| | | | | | 703/23 |
| 2003/0052735 | A1 * | 3/2003 | Kang | ...................... | G11C 11/22 |
| | | | | | 330/200 |

FOREIGN PATENT DOCUMENTS

JP          4050132 B2 *  2/2008  ............. G11C 11/22

* cited by examiner

*Primary Examiner* — Sultana Begum
(74) *Attorney, Agent, or Firm* — Pramudji Law Group PLLC; Ari Pramudji

(57) ABSTRACT

Various implementations described herein are related to a device having memory circuitry with an array of bitcells coupled to a power rail. The device may have pulse-bias circuitry with stacks of transistors that are coupled to the power rail. In various instances, the stacks of transistors may be alternately activated so as to thereby provide a pulse-biased power supply to the array of bitcells via the power rail.

19 Claims, 3 Drawing Sheets

MEMORY ARCHITECTURE WITH PULSED-BIAS POWER

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit designs, conventional memory devices may use write assist for transient voltage collapse to support low voltage operations. While some known techniques are used during low power operation, these known techniques typically fail to provide constant voltage collapse across memory instances with different rows-per-bitline (RPB) or across different process, voltage and temperature (PVT) conditions. Thus, these known techniques are insufficient for their intended purpose and are also area inefficient, which typically degrades memory performance. Also, known conventional techniques that may generate constant voltage collapse are also insufficient due to consuming large static power during a voltage collapse window of operation. Therefore, there exists a need to improve techniques for transient voltage collapse that provide constant voltage collapse across various operational conditions with area efficient implementation while reducing its power consumption in various memory related applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to pulsed-biasing power schemes and techniques for various memory related applications in physical circuit layout designs. Also, the various schemes and techniques described herein may provide for a robust low power transient-voltage collapse (TVC) architecture that may use one or more pulsed-bias inputs to produce constant vddc lowering across one or more or all rows-per-bitlines (RPB) while achieving lower power consumption and while producing lesser vddc pulse width. In various implementations, memory architecture may be configured as low power transient-voltage-collapse (TVC) architecture along with pulsed-bias circuitry and with RPB programmable delay buffering circuitry for use with some applications. In other implementations, memory architecture may be configured as low power TVC architecture with pulsed-biasing circuitry and with RPB programmable metal load tracking circuitry for use with other related applications. The pulsed-bias power schemes and techniques may be used in memory architecture that refers to various volatile memory and/or non-volatile memory, such as, e.g., static random access memory (SRAM). The memory architecture may include memory circuitry with an array of bitcells that are accessible via data access lines, such as, e.g., one or more wordlines and bitlines.

Various implementations of pulse-biased power schemes and techniques for memory applications will be described herein with reference to FIGS. 1-3.

Figure 1:
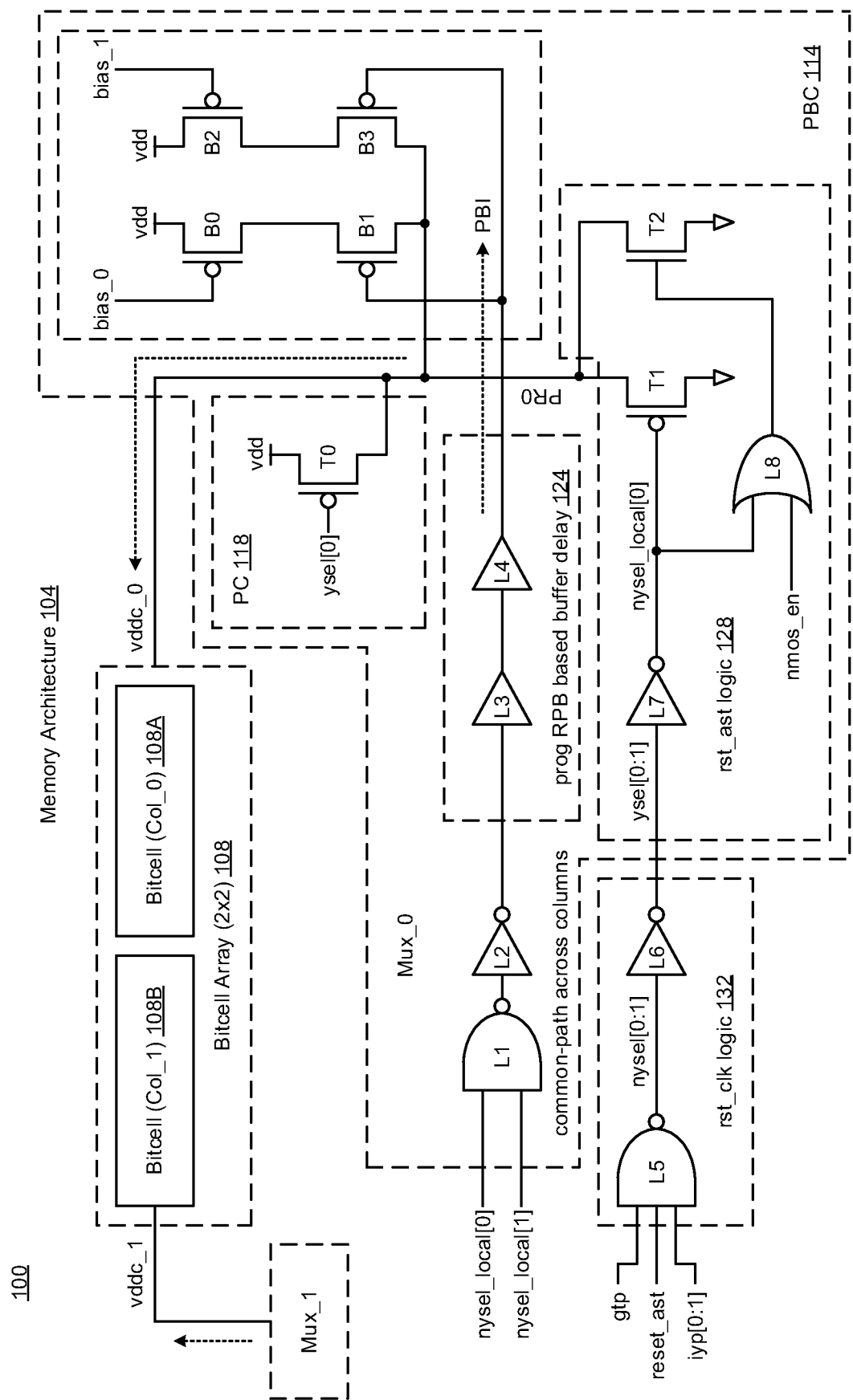
FIG. 1 illustrates a diagram of memory architecture with pulsed-biased power in accordance with various described herein.

FIG. 1 illustrates a schematic diagram 100 of memory architecture 104 having pulsed-biased power in accordance with implementations described herein. In particular, the memory architecture 104 may be configured as low power transient-voltage-collapse (TVC) architecture with pulsed-biasing circuitry and rows-per-bitline (RPB) programmable delay buffering circuitry for use with memory based applications.

In various implementations, the memory architecture 104 may be implemented as a system or device having various integrated circuit (IC) components that are arranged and coupled together as an assemblage or combination of parts that provide for physical circuit designs and various related structures. In some instances, a method of designing, building, fabricating and/or manufacturing the memory architecture 104 as an integrated system or device may involve use of various IC circuitry and components described herein so as to thereby implement the pulse-biased power schemes and techniques associated therewith. Also, the memory architecture 104 may be integrated with computing circuitry and related components on a single chip, and also, the pulse-biased power architecture 104 may be implemented in embedded systems for automotive, electronic, mobile, server and Internet-of-things (IoT) applications, including remote sensor nodes.

As shown in FIG. 1, the memory architecture 104 may have various memory related circuitry and components including, e.g., a bitcell array 108 with a first bitcell array 108A arranged in a first column (Col_0) along with a second bitcell array 108B arranged in a second column (Col_1). In some instances, the bitcell array 108 may refer to a 2×2 bitcell array having 2 bitcells in the first column (Col_0) for the first bitcell array 108A along with 2 other bitcells in the second column (Col_1) for the second bitcell array 108B. Also, the memory architecture 104 may include column multiplexer circuitry including, e.g., first multiplexer circuitry (Mux_0) that is coupled to the first column (Col_0) of the first bitcell array 108A along with second multiplexer circuitry (Mux_1) that is coupled to the second column (Col_1) of the second bitcell array 108B. The first multiplexer circuitry (Mux_0) may be configured to provide a first power supply (vddc_0) to the first bitcell array 108A, and also, the second multiplexer circuitry (Mux_1) may be configured to provide a second power supply (vddc_1) to the second bitcell array 108B. For simplicity, the first multiplexer circuitry (Mux_0) is described in detail; however, the second multiplexer circuitry (Mux_1) has similar features, components, behaviors and characteristics in a manner as described herein in reference to the first multiplexer circuitry (Mux_0).

In various implementations, as shown in FIG. 1, the first multiplexer circuitry (Mux_0) may have various circuitry and/or components including, e.g., pulse-bias circuitry (PBC 114) that is coupled to the bitcell array 108 via a power rail (PR0). The first bitcell array 108A may be coupled to a power rail (PR0), and the pulse-bias circuitry (PBC 114) may have stacks of transistors (B0/B1, B2/B3) that are coupled to the first bitcell array 108A via the power rail (PR0). The stacks of transistors (B0/B1, B2/B3) may be alternately activated so as to provide a pulse-biased power supply (vddc_0) to the bitcell array 108 via the power rail (PR0). Also, the pulse-bias circuitry (PBC 114) may have programmable delay logic 124 that provides a pulsed-bias input (PBI) to gates of the stacks of transistors (B0/B1, B2/B3) so as assist the stacks of transistors (B0/B1, B2/B3) with generating the pulse-biased power supply (vddc_0) with a reduced pulse width. In some instances, the stacks of transistors (B0/B1, B2/B3) may be alternately activated and deactivated using bias-enable inputs (bias_0, bias_1) along with pulsed-bias inputs (PBI) so as to generate the pulse-biased power supply (vddc_0).

In some implementations, the stacks of transistors (B0/B1, B2/B3) may include a first pull-up stack of transistors (B0/B1) and a second pull-up stack of transistors (B2/B3) that are coupled in parallel to the power rail (PR0). Also, the bias-enable inputs (bias_0, bias_1) may have a first bias-enable input (bias_0) that is applied to gates of the first pull-up stack of transistors (B0/B1), and the bias-enable inputs (bias_0, bias_1) may include a second bias-enable input (bias_1) that is applied to gates of the second pull-up stack of transistors (B2/B3). In some instances, the first pull-up stack of transistors (B0/B1) may refer to a first pair of transistors (B0/B1) that are coupled in series between a source power supply (vdd) and the power rail (PR0). The first bias-enable input (bias_0) may be applied to a gate of an upper transistor (B0) of the first pair of transistors (B0/B1) for activation and deactivation of the upper transistor (B0), and also, the pulsed-bias input (PBI) may be applied to a gate of a lower transistor (B1) of the first pair of transistors (B0/B1) for activation and deactivation of the lower transistor (B1). Moreover, in some instances, the second pull-up stack of transistors (B2/B3) may refer to a second pair of transistors (B2/B3) that are coupled in series between the source power supply (vdd) and the power rail (PR0). The second bias-enable input (bias_1) may be applied to a gate of an upper transistor (B2) of the second pair of transistors (B2/B3) for activation and deactivation of the upper transistor (B2), and the pulsed-bias input (PBI) may be applied to a gate of a lower transistor (B3) of the second pair of transistors (B2/B3) for activation and deactivation of the lower transistor (B3).

Figure 2:
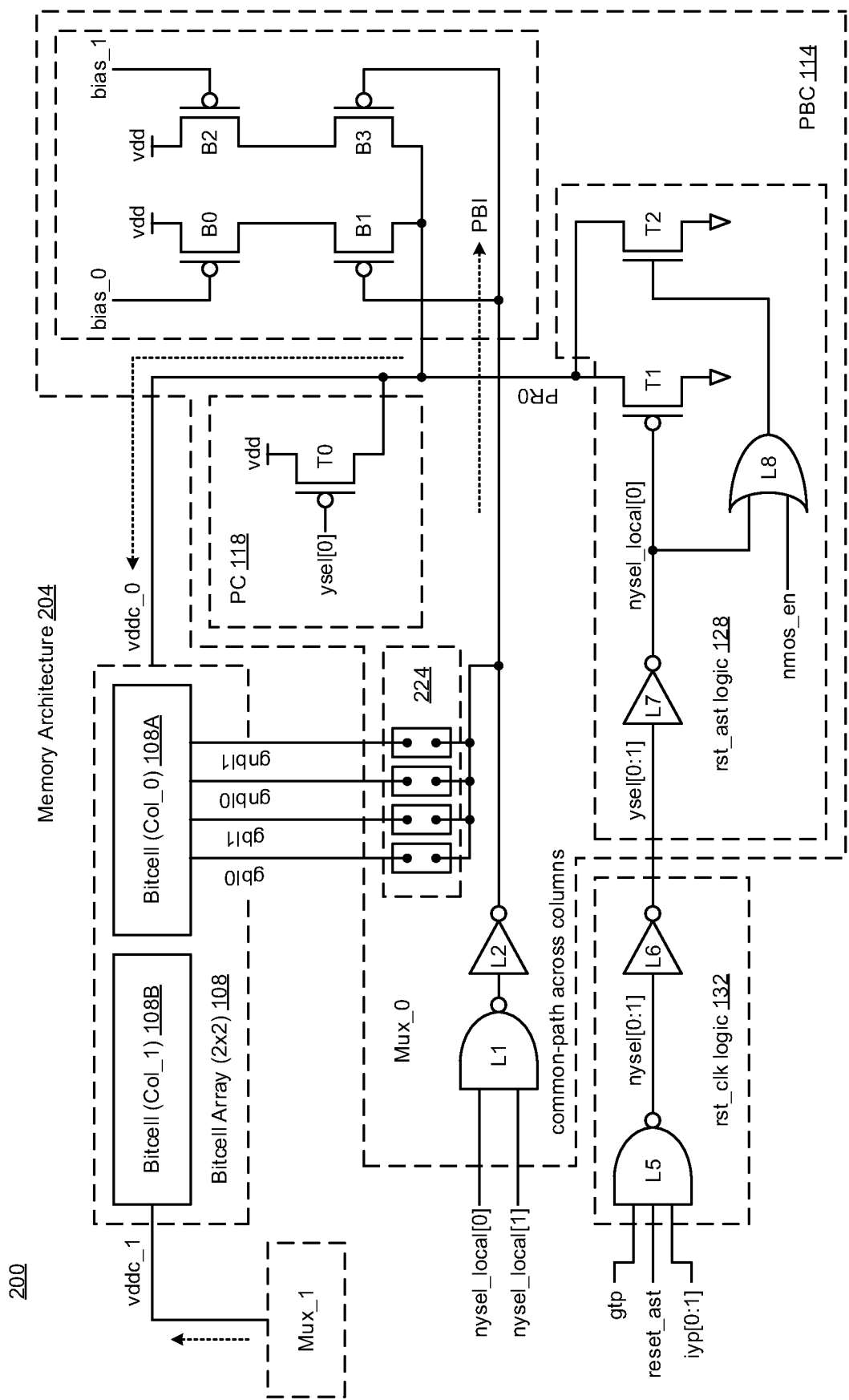
FIG. 2 illustrates a diagram of memory architecture with pulsed-biased power in accordance with various implementations described herein.

In various implementations, the first multiplexer circuitry (Mux_0) may include the programmable delay logic 124 that is implemented as a programmable delayed buffer (e.g., with one or more buffers L3, L4) or a programmable metal load (e.g., 224, as shown in FIG. 2). In some instances, the pulsed-bias input (PBI) may be enabled after pulling-down the power rail (PR0) to a lower level based on the programmable delayed buffer or the programmable metal load. Also, in some instances, a voltage level on the power rail (PR0) may be stabilized after activating the stacks of transistors (B0/B1, B2/B3) with the programmable delayed buffer or the programmable metal load, and direct-current (DC) power consumption is reduced during fall of the voltage level along with improvement of fall-time of the voltage level. Moreover, the first multiplexer circuitry (Mux_0) may include common-path logic (L1, L2) that is arranged and configured to receive local write select signals (nysel_local[0], nysel_local[0]) and provide an output signal to the programmable delay logic 124 for generation of the pulsed-bias input (PBI) signal.

In various implementations, the first multiplexer circuitry (Mux_0) may include precharge circuitry (PC 118) with at least one transistor (T0) that is coupled to the power rail (PR0), and the transistor (T0) may be configured to pre-charge the power rail (PR0) to the source power supply (vdd) when activated with a write select signal (ysel[0]). Further, the first multiplexer circuitry (Mux_0) may have reset-assist logic 128 (T1, T2, L7, L8) that is coupled to the power rail (PR0), and the read-assist logic 128 (T1, T2, L7, L8) may be configured to assist the transistor (T0) with pre-charging the power rail (PR0). Moreover, the memory architecture 104 may include reset clock logic 132 (L5, L6) that is configured to receive multiple input signals (gtp, reset_ast, iyp[0:1]) and provide an output signal to the reset-assist logic 128 for generation of the pulsed-bias input (PBI) signal.

In some instances, the gtp input signal may refer to a global timing pulse that is applied as an input to the logic gate (L5) of the reset_clock logic 132. Also, the reset_ast input signal may refer to a reset assist signal that is applied as another input to the logic gate (L5) of the reset_clock logic 132, and the reset assist signal (reset_ast) may be used to enable operability an/or functionality of the pulsed-bias power schemes and techniques associated with the memory architecture 104. Also, the iyp[0:1] input signal may refer to another enable/activation signal that is applied as another input to the logic gate (L5) of the reset_clock logic 132 for enabling pulsed-bias power.

In various implementations, the read-assist logic 128 may include one or more transistors (T1, T2) and one or more logic gates (L7, L8). For instance, the logic gate (L7) may receive an input signal (ysel[0:1]) from the reset-clock logic 132 and provide an output signal (nysel_local[0]) to a gate of transistor (T1) and an input of the logic gate (L8). Also, the logic gate (T8) may receive multiple inputs (nysel_local[0], nmos_en) and then provide an output signal to a gate of transistor (T2). Also, transistor (T1) may be coupled between the power rail (PR0) and ground (vss or gnd), and transistor (T1) may be activated based on the nysel_local[0] signal. Also, transistor (T2) may be coupled between the power rail (PR0) and ground (vss or gnd), and transistor (T2) may be activated based on the output signal from the logic gate (T8).

In some implementations, the pulse-bias circuitry (PBC 114) may be configured to provide the pulse-biased power supply (vddc_0) to the power rail (PR0) during a pulse-biasing cycle, and the precharge circuitry (PC 118) may be configured to precharge the power rail (PR0) at an end of the pulse-biasing cycle, e.g., based on the reset-assist signal (reset_ast). As such, the various pulse-biased power schemes and techniques described herein refer to a robust low power transient-voltage-collapse (TVC) scheme and technique using the pulsed-bias input (PBI), which may provide constant vddc lowering across rows-per-bitline (RPB), while having lower power consumption and produce lesser vddc pulse width. One idea presented herein is to apply pulsed-bias inputs (e.g., PBI) to the pull-up stacks of transistors (B0/B1, B2/B3) that are activated/deactivated using the bias-enable inputs (bias_0, bias_1). In some instances, the pulsed-bias power supply (vddc_0) may be enabled after pulling down vddc_0 on the power rail (PR0) to a sufficient lowering level based on RPB based delay 124 with the programmable delayed buffer (in FIG. 1) or the programmable metal load (in FIG. 2). In some situations, this approach may reduce the high DC power consumption during vddc_0 fall and may improve vddc_0 fall time. Also, in some situations, the vddc_0 level is stabilized after the stacked bias pull-up transistors (B0/B1, B2/B3) are enabled through the RPB dependent delay, and then the vddc_0 pulse may be closed and precharged at the end of the cycle with the reset_ast signal, which is a vddc_0 assist tracking signal. In various instances, there may be an undershoot before the bias pull-up is enabled, which may be reduced by adjusting the programmable bias enable delay and the pull-down-to-bias PMOS sizes. Moreover, race between pull-down PMOS and pull-up bias PMOS may be local to each column-block as they are controlled by the nysel_local[0:1] signal in each column.

FIG. 2 illustrates a schematic diagram 200 of memory architecture 204 having pulsed-biased power in accordance with implementations described herein. In particular, the memory architecture 104 may be configured as low power transient-voltage-collapse (TVC) architecture with pulsed-biasing circuitry and rows-per-bitline (RPB) programmable metal load tracking circuitry for use with memory based applications.

In various implementations, the memory architecture 104 may be implemented as a system or device having various integrated circuit (IC) components that are arranged and coupled together as an assemblage or combination of parts that provide for physical circuit designs and various related structures. In some instances, a method of designing, building, fabricating and/or manufacturing the memory architecture 104 as an integrated system or device may involve use of various IC circuitry and components described herein so as to thereby implement the pulse-biased power schemes and techniques associated therewith. Also, the memory architecture 104 may be integrated with computing circuitry and related components on a single chip, and also, the pulse-biased power architecture 104 may be implemented in embedded systems for automotive, electronic, mobile, server and Internet-of-things (IoT) applications, including remote sensor nodes.

In some implementations, as shown in FIG. 2, the memory architecture 204 may refer to a device or a memory device having similar circuitry and/or components along with similar features, behaviors and characteristics related to the memory architecture 104 shown in FIG. 1. For instance, the memory architecture 204 may have the bitcell array 108 with the array of bitcells 108A, 108B that are coupled to the power rail (PR0) or voltage rail. Also, the memory architecture 204 may have the pulsed-bias circuitry (PBC 114) with the stacks of transistors (B0/B1, B2/B3) that are alternately activated to generate a pulse-biased voltage supply (vddc_0) to the first array of bitcells 108A via the power rail (PR0) or the voltage rail. Also, the memory architecture 204 may have the programmable delay logic 224 that is configured to provide the pulsed-bias input (PBI) to alternately enable the stacks of transistors (B0/B1, B2/B3) so as assist the stacks of transistors (B0/B1, B2/B3) with generating the pulse-biased voltage supply (vddc_0) with a reduced pulse width.

In some implementations, as shown in FIG. 2, the programmable delay logic 224 may be configured as programmable metal load tracking circuitry, wherein one or more higher capacitance loads (e.g., gbl0, gbl1, gnbl0, gnbl1) may be used to assist with programming the programmable metal load tracking circuitry of the programmable delay logic 224. In some instances, the programmable delay logic 224 refers to a programmable rows-per-bitline (RPB) based global-bitline (GBL) load, wherein the GBL load is provided as a common-path across columns. Further, in some instances, the stacks of transistors (B0/B1, B2/B3) are alternately activated/deactivated using the bias-enable inputs (e.g., bias_0, bias_1) along with the pulsed-bias inputs (PBI) to generate the pulse-biased power supply (vddc_0). In various instances, the programmable metal load tracking may be used for changing capacitive load of an attached net so as to slow-down or speed-up performance of a driver driving the attached net. In these instances, programmable metal loading may be used to improve tracking of logic circuits as per the rows-per-bitline (RPB) of the memory instance, which may further assist in reducing or limiting DC power during the start of the Vdd collapse (i.e., transient voltage collapse of Vdd).

In various implementations, as shown in reference to FIGS. 1-2, the memory architectures 102, 204 may be configured to operate in various different biasing modes of operation. For instance, in a first biasing mode of operation, the memory architectures 102, 204 may be configured to utilize a PMOS pull-down transistor with both strong and weak pull-up bias. In a second biasing mode of operation, the memory architectures 102, 204 may be configured to utilize a PMOS pull-down with strong pull-up bias. In a third biasing mode of operation, the memory architectures 102, 204 may be configured to utilize a PMOS pull-down with weak pull-up bias. In a fourth biasing mode of operation, the memory architectures 102, 204 may be configured to utilize an NMOS pull-down and a PMOS pull-down with weak pull-up bias.

In various implementations, as shown in reference to FIGS. 1-2, various types of logic gate configurations and/or transistor based configurations may be used to thereby implement the memory architectures 104, 204 shown and described herein in reference to various pulse-biased power schemes and techniques described herein. For instance, transistors (B0, B1, B2, B3) may refer to P-type transistors, transistors (T0, T1) may refer to P-type transistors, and also, transistor (T2) may refer to an N-type transistor; however, various other transistor related configurations may be used to achieve similar behaviors and/or characteristics. In some instances, logic gates (L1, L5) may refer to NAND gates, logic gates (L2, L6, L7) may refer to inverters, logic gates (L3, L4) may refer to buffers, and logic gate (L8) may refer to an OR gate; however, various other logic-gate related configurations may be used to achieve similar behaviors and/or characteristics.

Figure 3:
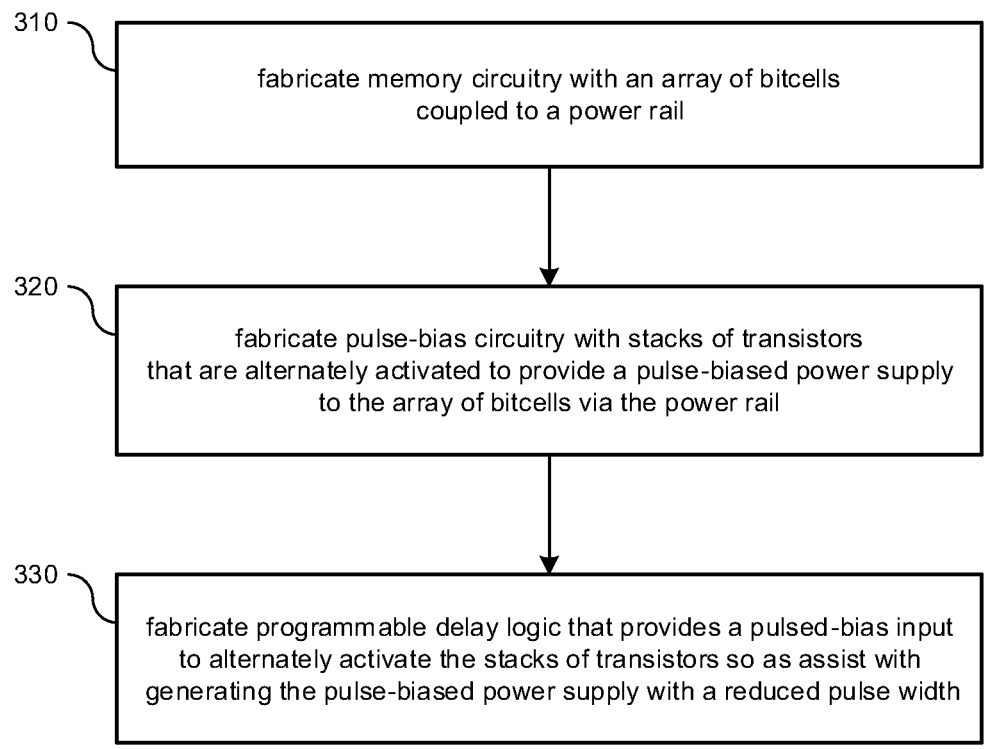
FIG. 3 illustrates a diagram of a method for providing memory architecture in accordance with various implementations described herein.

FIG. 3 illustrates a process diagram of a method 300 for providing memory architecture in accordance with various implementations described herein.

It should be understood that even though the method 300 indicates a particular order of operation execution, in some cases, various particular portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1-2. Also, if implemented in software, the method 300 may be implemented as a program and/or software instruction process configured for providing pulse-biased power schemes and techniques, as described herein. Also, if implemented in software, various instructions associated with implementing method 300 may be stored in memory and/or a database. For instance, various types of computing devices having a processor and memory may be configured to perform method 300.

In various implementations, method 300 may refer to a method of designing, providing, building, fabricating and/or manufacturing an integrated circuit (IC) device that may involve various pulse-biased power schemes and techniques described herein using various components and/or materials described herein. The integrated circuit (IC) device may be integrated in various computing circuitry and related components on a single chip, and further, the integrated circuit (IC) device may be implemented in embedded systems for various electronic, mobile and/or Internet-of-things (IoT) applications.

At block 310, method 300 may provide (or fabricate) memory circuitry with an array of bitcells coupled to a power rail. Also, at block 320, method 300 may provide (or fabricate) pulse-bias circuitry with stacks of transistors that are alternately activated to provide a pulse-biased power supply to the array of bitcells via the power rail. Further, at block 330, method 300 may provide (or fabricate) programmable delay logic that provides a pulsed-bias input to alternately activate the stacks of transistors so as thereby assist with generating the pulse-biased power supply with a reduced pulse width.

In some implementations, the pulse-bias circuitry has programmable delay logic that provides a pulsed-bias input to gates of the stacks of transistors so as thereby assist the stacks of transistors with generating the pulse-biased power supply with a reduced pulse width. The stacks of transistors may be alternately activated and deactivated using bias-enable inputs along with the pulsed-bias inputs to generate the pulse-biased power supply. The stacks of transistors may have a first pull-up stack of transistors and a second pull-up stack of transistors that are coupled in parallel to the power rail, and also, the bias-enable inputs may have a first bias-enable input that is applied to gates of the first pull-up stack of transistors. The bias-enable inputs may include a second bias-enable input that is applied to gates of the second pull-up stack of transistors. Also, the first pull-up stack of transistors may have a first pair of transistors coupled in series between a source power supply and the power rail, and the first bias-enable input may be applied to a gate of an upper transistor of the first pair of transistors for activation and deactivation of the upper transistor. The pulsed-bias input may be applied to a gate of a lower transistor of the first pair of transistors for activation and deactivation of the lower transistor. Also, the second pull-up stack of transistors may have a second pair of transistors that are coupled in series between a source power supply and the power rail, and the second bias-enable input may be applied to a gate of an upper transistor of the second pair of transistors for activation and deactivation of the upper transistor. Moreover, the pulsed-bias input is applied to a gate of a lower transistor of the second pair of transistors for activation and deactivation of the lower transistor.

In some implementations, the programmable delay logic may be implemented as a programmable delayed buffer or a programmable metal load, and also, the pulsed-bias input may be enabled after pulling-down the power rail to a lower level based on the programmable delayed buffer or the programmable metal load. Also, in some instances, a voltage level on the power rail may be stabilized after activating the stacks of transistors with the programmable delayed buffer or the programmable metal load, and direct-current (DC) power consumption is reduced during fall of the voltage level along with improvement of fall-time of the voltage level. Further, in some instances, method 300 may provide (or fabricate) precharge circuitry having a transistor that is coupled to the power rail, and also, the transistor may be configured to precharge the power rail to the source power supply when activated. Moreover, method 300 may provide (or fabricate) reset-assist logic that is coupled to the power rail, and also, the read-assist logic may be configured to assist the transistor with pre-charging the power rail. The pulse-bias circuitry may also provide the pulse-biased power supply to the power rail during a pulse-biasing cycle, and in some instances, the precharge circuitry may be configured to precharge the power rail at an end of the pulse-biasing cycle based on a reset-assist signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of a device having memory circuitry with an array of bitcells coupled to a power rail. The device may have pulse-bias circuitry with stacks of transistors coupled to the power rail. Also, in various instances, the stacks of transistors may be alternately activated so as to provide a pulse-biased power supply to the array of bitcells via the power rail.

Described herein are implementations of a memory device having an array of bitcells coupled to a voltage rail. The memory device may have stacks of transistors that may be alternately activated so as to generate a pulse-biased voltage supply to the array of bitcells via the voltage rail. The memory device may have programmable delay logic configured to provide a pulsed-bias input to alternately enable the stacks of transistors so as thereby assist the stacks of transistors with generating the pulse-biased voltage supply with a reduced pulse width.

Described herein are implementations of a method. The method may be used to fabricate memory circuitry with an array of bitcells coupled to a power rail. The method may be used to fabricate pulse-bias circuitry with stacks of transistors that are alternately activated to provide a pulse-biased power supply to the array of bitcells via the power rail. The method may be used to fabricate programmable delay logic that provides a pulsed-bias input to alternately activate the stacks of transistors so as thereby assist with generating the pulse-biased power supply with a reduced pulse width.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
memory circuitry having an array of bitcells coupled to a power rail; and
pulse-bias circuitry having stacks of transistors coupled to the power rail, wherein the stacks of transistors are alternately activated to provide a pulse-biased power supply to the array of bitcells via the power rail,
wherein the pulse-bias circuitry has programmable delay logic that provides a pulsed-bias input to gates of the stacks of transistors so as to assist the stacks of transistors with generating the pulse-biased power supply with a reduced pulse width.

2. The device of claim 1, wherein:
the stacks of transistors are alternately activated and deactivated using bias-enable inputs along with the pulsed-bias inputs to generate the pulse-biased power supply.

3. The device of claim 2, wherein:
the stacks of transistors include a first pull-up stack of transistors and a second pull-up stack of transistors that are coupled in parallel to the power rail,
the bias-enable inputs include a first bias-enable input that is applied to gates of the first pull-up stack of transistors, and
the bias-enable inputs include a second bias-enable input that is applied to gates of the second pull-up stack of transistors.

4. The device of claim 3, wherein:
the first pull-up stack of transistors includes a first pair of transistors coupled in series between a source power supply and the power rail,
the first bias-enable input is applied to a gate of an upper transistor of the first pair of transistors for activation and deactivation of the upper transistor, and
the pulsed-bias input is applied to a gate of a lower transistor of the first pair of transistors for activation and deactivation of the lower transistor.

5. The device of claim 3, wherein:
the second pull-up stack of transistors includes a second pair of transistors coupled in series between a source power supply and the power rail,
the second bias-enable input is applied to a gate of an upper transistor of the second pair of transistors for activation and deactivation of the upper transistor, and
the pulsed-bias input is applied to a gate of a lower transistor of the second pair of transistors for activation and deactivation of the lower transistor.

6. The device of claim 1, wherein:
the programmable delay logic is implemented as a programmable delayed buffer or a programmable metal load, and
the pulsed-bias input is enabled after pulling-down the power rail to a lower level based on the programmable delayed buffer or the programmable metal load.

7. The device of claim 6, wherein:
a voltage level on the power rail is stabilized after activating the stacks of transistors with the programmable delayed buffer or the programmable metal load, and
direct-current (DC) power consumption is reduced during fall of the voltage level along with improvement of fall-time of the voltage level.

8. The device of claim 7, further comprising:
precharge circuitry having a transistor coupled to the power rail, wherein the transistor precharges the power rail to a source power supply when activated; and
reset-assist logic coupled to the power rail, wherein the read-assist logic assists the transistor with pre-charging the power rail.

9. The device of claim 8, wherein:
the pulse-bias circuitry provides the pulse-biased power supply to the power rail during a pulse-biasing cycle, and
the precharge circuitry is configured to precharge the power rail at an end of the pulse-biasing cycle based on a reset-assist signal.

10. A memory device comprising:
an array of bitcells coupled to a voltage rail;
stacks of transistors that are alternately activated to generate a pulse-biased voltage supply to the array of bitcells via the voltage rail; and
programmable delay logic that provides a pulsed-bias input to alternately enable the stacks of transistors so as thereby assist the stacks of transistors with generating the pulse-biased voltage supply with a reduced pulse width.

11. The memory device of claim 10, wherein:
the stacks of transistors are alternately activated and deactivated using bias-enable inputs along with the pulsed-bias inputs to generate the pulse-biased power supply.

12. The memory device of claim 11, wherein:
the stacks of transistors include a first pull-up stack of transistors and a second pull-up stack of transistors that are coupled in parallel to the voltage rail,
the bias-enable inputs include a first bias-enable input that is applied to gates of the first pull-up stack of transistors, and
the bias-enable inputs include a second bias-enable input that is applied to gates of the second pull-up stack of transistors.

13. The memory device of claim 12, wherein:
the first pull-up stack of transistors includes a first pair of transistors coupled in series between a source power supply and the voltage rail,
the first bias-enable input is applied to a gate of an upper transistor of the first pair of transistors for activation and deactivation of the upper transistor, and
the pulsed-bias input is applied to a gate of a lower transistor of the first pair of transistors for activation and deactivation of the lower transistor.

14. The memory device of claim 12, wherein:
the second pull-up stack of transistors includes a second pair of transistors coupled in series between a source power supply and the voltage rail,
the second bias-enable input is applied to a gate of an upper transistor of the second pair of transistors for activation and deactivation of the upper transistor, and
the pulsed-bias input is applied to a gate of a lower transistor of the second pair of transistors for activation and deactivation of the lower transistor.

15. The memory device of claim 10, wherein:
the programmable delay logic is implemented as a programmable delayed buffer or a programmable metal load, and
the pulsed-bias input is enabled after pulling-down the voltage rail to a lower level based on the programmable delayed buffer or the programmable metal load.

16. The memory device of claim 15, wherein:
a voltage level on the voltage rail is stabilized after activating the stacks of transistors with the programmable delayed buffer or the programmable metal load, and
direct-current (DC) power consumption is reduced during fall of the voltage level along with improvement of fall-time of the voltage level.

17. The memory device of claim 16, further comprising:
precharge logic having a transistor coupled to the voltage rail, wherein the transistor precharges the voltage rail to a source power supply when activated; and
reset-assist logic coupled to the voltage rail, wherein the read-assist logic assists the transistor with pre-charging the voltage rail.

18. The memory device of claim 17, wherein:
the programmable delay logic provides the pulse-biased power supply to the voltage rail during a pulse-biasing cycle, and
the precharge logic is configured to precharge the voltage rail at an end of the pulse-biasing cycle based on a reset-assist signal.

19. A method comprising:
fabricating memory circuitry with an array of bitcells coupled to a power rail;
fabricating pulse-bias circuitry with stacks of transistors that are alternately activated to provide a pulse-biased power supply to the array of bitcells via the power rail; and
fabricating programmable delay logic that provides a pulsed-bias input to alternately activate the stacks of transistors so as assist with generating the pulse-biased power supply with a reduced pulse width.

* * * * *